United States Patent [19]

Aldinger et al.

[11] Patent Number: 4,591,537
[45] Date of Patent: May 27, 1986

[54] COMBINATION OF ALN-$Y_2O_3$ HEAT CONDUCTIVE CERAMIC SUBSTRATE AND ELECTRONIC COMPONENT

[75] Inventors: Fritz Aldinger, Rodenbach; Richard Keilberth, Kleinheubach; Waltraud Werdecker, Hanau, all of Fed. Rep. of Germany

[73] Assignee: W. C. Heraeus GmbH, Hanau, Fed. Rep. of Germany

[21] Appl. No.: 741,711

[22] Filed: Jun. 5, 1985

Related U.S. Application Data

[63] Continuation of Ser. No. 563,026, Dec. 19, 1983, abandoned.

[30] Foreign Application Priority Data

Dec. 24, 1982 [DE] Fed. Rep. of Germany ....... 3247985

[51] Int. Cl.$^4$ .................... B32B 9/00; C04B 35/58
[52] U.S. Cl. .................... 428/698; 174/16 HS; 361/386; 361/387; 428/901; 501/96; 501/98; 501/152
[58] Field of Search ............. 174/16 HS; 501/96, 98, 501/152; 428/698, 901; 361/386, 387

[56] References Cited

U.S. PATENT DOCUMENTS

| 3,108,887 | 10/1963 | Lenie et al. | 501/98 |
|---|---|---|---|
| 3,473,894 | 10/1969 | Babl et al. | 423/290 |
| 3,718,490 | 2/1973 | Morgan et al. | 423/412 |
| 3,813,252 | 5/1974 | Lipp | 501/98 |
| 3,930,875 | 1/1976 | Ochiai et al. | 501/98 |
| 4,097,293 | 6/1978 | Komeya et al. | 501/98 |
| 4,188,194 | 2/1980 | Corrigan | 423/290 |
| 4,203,733 | 5/1980 | Tanaka et al. | 501/98 |
| 4,256,792 | 3/1981 | Koepke et al. | 264/61 |
| 4,289,503 | 9/1981 | Corrigan | 423/290 |
| 4,299,873 | 11/1981 | Ogihara et al. | 428/210 |
| 4,435,513 | 3/1984 | Komeya et al. | 501/96 |
| 4,478,785 | 10/1984 | Huseby et al. | 501/98 |
| 4,519,966 | 5/1985 | Aldinger et al. | 501/98 |
| 4,540,675 | 9/1985 | Takeda et al. | 501/98 |

FOREIGN PATENT DOCUMENTS

| 0040552 | 11/1981 | European Pat. Off. | 698/ |
|---|---|---|---|
| 3313836 | 10/1984 | Fed. Rep. of Germany. | |
| 50-8800 | 1/1975 | Japan | 423/290 |
| 54-12488 | 5/1979 | Japan | 501/95 |
| 54-100410 | 8/1979 | Japan | 501/96 |
| 58-32072 | 2/1983 | Japan | 501/96 |
| 58-32073 | 2/1983 | Japan. | |

OTHER PUBLICATIONS

Chem. Abstracts vol. 99 (Jul. 25, '83) p. 274, Abstract No. 26975r.
Chem. Abstracts 99 (Jul. 25, '83) p. 275 Abstr. No. 26981q.
Slack, G. A., "Nonmetallic Crystals with High Thermal Conductivity" J. Phys. Chem. Solids, 34 (1973) pp. 321-335.
Heraeus Trade Circular PS-B80 "Sonderkeramik Aluminiumnitride" 4 pages, Mar. 1983.
Ryatsev, K. I. et al., Chem. Abstracts—vol. 95, Item #11386t (1981) "Effect of Some Additives on the Fritting and Microstructure on Aluminum Nitride Ceramics".
Komeya, K. et al.—"Effect of Various Additives on Sintering of Aluminum Nitride—Yogyo-Kyokai-Shi 89(6), pp. 330-336.

Primary Examiner—Helen M. McCarthy
Attorney, Agent, or Firm—Frishuaf, Holtz, Goodman & Woodward

[57] ABSTRACT

A heat conductive ceramic substrate for semiconductor circuits, comprising polycrystalline aluminum nitride of high density containing as an additive boron nitride or oxides of calcium, magnesium, aluminum, titanium, zirconium, chrome, silicon, and/or rare earth metals. The boron nitride additive concentration ranges between 0.1 and 3% by weight, preferably between 0.5 and 2% by weight. The oxide additive concentration ranges between 0.1 and 5% by weight. The substrate has a significantly higher thermal conductivity than aluminum oxide substrates and is more economincal to manufacture than beryllium oxide substrates.

9 Claims, 1 Drawing Figure

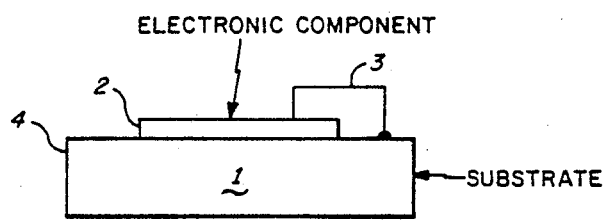

COMBINATION OF ALN-Y₂O₃ HEAT CONDUCTIVE CERAMIC SUBSTRATE AND ELECTRONIC COMPONENT

This application is a continuation of application Ser. No. 563,026, filed Dec. 19, 1983, abandoned.

Cross reference to related application, assigned to the assignee of the present application, the disclosure of which is hereby incorporated by reference: "CRUCIBLE FOR MONOCRYSTAL PULLING", U.S. Ser. No. 563,647, filed Dec. 20, 1983, ALDINGER et al, now U.S. Pat. No. 4,519,966.

The present invention relates generally to ceramic substrates for semiconductor circuit elements, and more particularly to an improved ceramic substrate exhibiting greater heat conductivity and reduced chemical toxicity.

BACKGROUND

As electronic circuits become more and more miniaturized, the density of heat-producing circuit elements increases, requiring greater and greater heat conductivity in the ceramic substrate to dissipate this heat and prevent it from interfering with the normal operation of the circuits. For some applications, the conventional aluminum oxide substrates have inadequate heat conductivity. It is known to solve this problem by substituting beryllium oxide, which has an eight-fold better heat conductivity, for the aluminum oxide, but this is considerably more expensive. It has been found that a particular problem is the extreme toxicity of beryllium oxide dust, which practically precludes subsequent processing steps by the user such as grinding or polishing. Finishing must be performed in specially monitored work stations. U.S. Pat. No. 3,813,252 discloses similar sintered compositions.

THE INVENTION

It is an object to provide a substrate which exhibits greater thermal conductivity, can be more economically manufactured than beryllium oxide substrates, and is non-toxic.

Briefly, a substrate of high density polycrystalline aluminum nitride has been found to satisfy these requirements. It is particularly advantageous to use aluminum nitride with additives of boron nitride or at least one oxide of calcium, chrome, magnesium, aluminum, titanium, zirconium, silicon, and rare earth metals. A suitable oxide of a rare earth metal is yttrium oxide.

The concentration of boron nitride additives should be from about 0.1 to 3% by weight, and preferably from 0.5 to 2% by weight.

The concentration of the oxide additives should be from 0.1 to 5% by weight, and preferably up to 3% by weight.

Aluminum nitride cannot be readily sintered because of its covalent bonding characteristics, so that sintering without pressure cannot achieve high density and good mechanical solidity. With low density, i.e. in a material with a high porosity, one cannot approach the theoretical values for thermal conductivity, which for aluminum nitride are 320 W/m°K. which is well above the theoretical thermal conductivity of aluminum oxide (28 W/m°K.).

The substrate of the present invention is manufactured from aluminum nitride raw material, either by hot pressing or hot isostatic pressing of additive-free material or, more economically, by sintering with boron nitride additive or oxide additives in a nitrogen atmosphere. The addition of boron nitride or oxide additives permits production of a high density and high thermal conductivity which, depending upon the kind and concentration of the additive, falls above the thermal conductivity of beryllium oxide found in the trade. The theoretical thermal conductivity of beryllium oxide (pore-free, high-purity material) is about 218 W/m°K. Further, the high compression permits a high mechanical solidity to be achieved. In terms of good compressibility of the aluminum nitride, the oxide additives are as satisfactory as the boron nitride additives. The highest thermal conductivity is achieved with the oxide additives.

EXAMPLE 1

100 grams of a pulverized mixture of 99% by weight aluminum nitride and 1% by weight hexagonal boron nitride is milled for 25 hours in a ceramic vessel with 100 grams of ceramic grinding medium. This mixture is sieved through a sieve with a mesh size of 200 micrometers. The powder thus prepared is pressed in a matrix into plates sized 25×25×1 mm.

After introduction of the plates into a graphite-heated sintering apparatus, the apparatus was evacuated to $10^{-5}$ millibars and, subsequently, a nitrogen pressure of 5 milibars was introduced. Within three hours, the temperature was raised to 1300° C. During this period, a nitrogen pressure of 5 millibars was maintained. At 1300° C., the nitrogen pressure was permitted to rise to 140 millibars and the valve was closed. Within an hour, the temperature was raised to 1900° C. At this temperature, the nitrogen pressure reached 190 millibars. After a two-hour holding period under these conditions, the apparatus was shut off and permitted to cool to room temperature over a course of 12 hours. Thereafter, the apparatus was vented and the fully sintered substrate was removed. The substrate thus made can be installed immediately or, if desired, cut up and polished on one side.

EXAMPLE 2

100 grams of a pulverized mixture of 98% by weight fine aluminum nitride powder (grain size according to FFS 1.5 micrometers) and 2% by weight yttrium oxide with a grain size in the sub-micron range was milled in a pestle. This mixture was sieved through a sieve with a mesh size of 60 micrometers and pressed in a matrix to plates sized 25×25×1 mm or to small rods with the dimensions 5×5×70 mm. The plates and rods were placed in a graphite-heated sintering apparatus using a molybdenum supporting sheet.

After evacuation of the sintering apparatus to a pressure of $10^{-5}$ millibars, a nitrogen pressure of 5 millibars was introduced. Within two hours, the temperature was raised to 1100° C. During this period, a nitrogen pressure of 5 millibars was maintained. At 1100° C., the nitrogen pressure was permitted to rise to 120 millibars and the valve was closed. Within an hour the temperature was raised to 1800° C. At this temperature, the nitrogen pressure had reached 180 millibars. After a two-hour holding period under these conditions, the apparatus was shut off and permitted to cool to room temperature over the course of about 12 hours. The apparatus was vented and the sintered plates and short rods were removed. The plates are used, either immediately or after polishing on one side, for thick film paste coating applications. The rods are either polished or ground or immediately cut on an inner hole saw into thin sqauare flakes, which in turn are used for vapor deposition coating.

The thermal conductivity of this substrate amounts to 184 W/m°K. The hardness, measured in Knoop with a loading of 500 grams, averages 955. Knoop hardness is the measure of the depth to which a bluntly pointed diamond pyramid will penetrate into the metal.

The measured thermal conductivity of the material made in accordance with the present invention ranges, depending upon the kind and concentration of additives, on the average, between 140 and 180 W/m°K. and thus is up to six times higher than that of pure aluminum oxide. These values were determined from material samples with a relative density between 90 and 98% of the theoretical density. The thermal conductivity would be further augmented if greater compression and purer materials were used. The highest hardness value measured (in Knoop under loading of 500 grams) for the material of the present invention is about 1110, while the maxium hardness attainable for the same raw material in an undoped condition is 240 Knoop.

Among the advantages of the substrate of the present invention are the facts that it has good dielectric characteristics, good stability through temperature changes, better thermal conductivity than aluminum oxide, and is more economical to make than beryllium oxide. A further advantage of the substrate of the invention is its lack of toxicity.

DRAWING

The single FIGURE is a schematic cross-section through the substrate and components mounted thereon.

DETAILED DESCRIPTION

A block or sheet 1 of the substrate of the present invention supports and dissipates heat from a heat producing electronic component such as a thyristor or transistor. Electrical connection means to other components can be provided by a wire 3 and/or a layer 4 of electrically conductive material deposited in a desired pattern on one or both sides of the substrate. If it is desired to have connections on the underside of the substrate, holes can be drilled through the substrate to receive leads from the electronic component. Alternatively, the component can be secured by cementing.

The abbreviation "W/m°K." stands for the units watt per meter and kelvin.

The abbreviation "FSSS" stands for Fisher Sub Sieve Sizer.

We claim:
1. The combination of
   a heat conductive ceramic substrate and an electronic component, comprising
   a sheet of non-toxic, high density, polycrystalline substrate material (1) consisting of
   aluminum nitride and an additive consisting of yttrium oxide, being present in between 0.1 to 5% (by weight);
   and wherein an electronic component (2) is provided, secured in heat conductive contact with the substrate, and electrical connection means (3, 4) are provided, attached to said component, the heat conductive ceramic substrate conducting heat away, generated in operation of the electronic component (2) secured in heat conductive contact with the substrate.
2. Combination according to claim 1, wherein the yttrium oxide is present up to 3%, by weight.
3. Combination according to claim 1, wherein the yttrium oxide is present in the amount of 2%.
4. Combination according to claim 1, wherein the electronic component comprises an electronic circuit element in film form applied to said substrate material.
5. Combination according to claim 1, wherein the electronic component comprises an electronic circuit element in thick-film form applied to said substrate material.
6. Combination according to claim 2, wherein the electronic component comprises an electronic circuit element in film form applied to said substrate material.
7. Combination according to claim 2, wherein the electronic component comprises an electronic circuit element in thick-film form applied to said substrate material.
8. Combination according to claim 3, wherein the electronic component comprises an electronic circuit element in film form applied to said substrate material.
9. Combination according to claim 3, wherein the electronic component comprises an electronic circuit element in thick-film form applied to said substrate material.

* * * * *